United States Patent
Yoo

(10) Patent No.: US 11,144,103 B2
(45) Date of Patent: Oct. 12, 2021

(54) PORTABLE ELECTRONIC DEVICE AND METHOD FOR EXPANDING INNER SPACE OF MAIN BODY OF THE SAME

(71) Applicant: Samsung Electronics Co., Ltd., Gyeonggi-do (KR)

(72) Inventor: Byungwook Yoo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 110 days.

(21) Appl. No.: 16/712,072

(22) Filed: Dec. 12, 2019

(65) Prior Publication Data

US 2020/0201405 A1    Jun. 25, 2020

(30) Foreign Application Priority Data

Dec. 21, 2018  (KR) .......................... 10-2018-0167726

(51) Int. Cl.
*G06F 1/20* (2006.01)
*H05K 7/20* (2006.01)
*G06F 1/16* (2006.01)

(52) U.S. Cl.
CPC .............. *G06F 1/206* (2013.01); *G06F 1/203* (2013.01); *H05K 7/20136* (2013.01);
(Continued)

(58) Field of Classification Search
CPC .................................. G06F 1/206; G06F 1/203
See application file for complete search history.

(56) References Cited

U.S. PATENT DOCUMENTS 6,069,793 A * 5/2000 Maruyama ................ G06F 1/20
165/104.33
6,487,074 B1 * 11/2002 Kimura ..................... G06F 1/20
165/80.3
(Continued)

FOREIGN PATENT DOCUMENTS

CN      201548897 U    8/2010
JP     2012-074524 A   4/2012
(Continued)

OTHER PUBLICATIONS

International Search Report dated Mar. 24, 2020.

*Primary Examiner* — Nidhi Thaker
(74) *Attorney, Agent, or Firm* — Cha & Reiter, LLC

(57) ABSTRACT

An electronic device and method are disclosed herein. The electronic device includes a processor, a temperature sensor, a main board on which the processor and the temperature sensor are mounted, a main body including a first surface and a second surface, an input device disposed on the first surface and the main board disposed on the second surface, wherein the first surface and second surface define a hollow in which the main board is disposed, a display, height adjuster disposed between the first and second surfaces and including a connection terminal connected to the processor, an extendable bar connected to the connection terminal, and a spacer connected to the extension bar. The processor implements the method, including in response to receiving a detection signal from the temperature sensor, control actuation of the height adjuster to cause expansion or contraction of the hollow by movement of the first and second surfaces.

19 Claims, 8 Drawing Sheets

(52) U.S. Cl.
CPC ....... *H05K 7/20209* (2013.01); *G06F 1/1616* (2013.01); *G06F 1/1656* (2013.01)

(56) References Cited

U.S. PATENT DOCUMENTS

| | | | |
|---|---|---|---|
| 7,929,292 B2* | 4/2011 | Li | G06F 1/1616 |
| | | | 361/679.46 |
| 8,976,524 B2* | 3/2015 | Wang | H05K 5/0213 |
| | | | 361/692 |
| 9,710,026 B2* | 7/2017 | Delano | G06F 1/182 |
| 9,939,861 B2* | 4/2018 | Knepper | G06F 1/206 |
| 10,015,449 B2 | 7/2018 | Logvinov et al. | |
| 10,199,306 B2* | 2/2019 | Chen | G06F 1/203 |
| 10,356,941 B2* | 7/2019 | Xu | H05K 7/2039 |
| 10,579,159 B2* | 3/2020 | Morrison | G06F 1/1662 |
| 2010/0157530 A1 | 6/2010 | Li et al. | |
| 2013/0163201 A1 | 6/2013 | Wang et al. | |
| 2020/0060043 A1 | 2/2020 | Lee et al. | |

FOREIGN PATENT DOCUMENTS

| | | |
|---|---|---|
| KR | 10-2003-0020178 A | 3/2003 |
| KR | 10-1834373 B1 | 4/2018 |
| WO | 2014/158481 A1 | 10/2014 |
| WO | 2018/092949 A1 | 5/2018 |

* cited by examiner

PORTABLE ELECTRONIC DEVICE AND METHOD FOR EXPANDING INNER SPACE OF MAIN BODY OF THE SAME

CROSS-REFERENCE TO RELATED APPLICATION(S)

This application is based on and claims priority under 35 U.S.C. 119 to Korean Patent Application No. 10-2018-0167726, filed on Dec. 21, 2018, in the Korean Intellectual Property Office, the disclosure of which is incorporated by reference herein in its entirety.

BACKGROUND

1. Technical Field

The disclosure relates to a portable electronic device and, more particularly, to expanding an interior space defined within a main body of a portable electronic device.

2. Description of Related Art

With the growth of technology, a variety of portable electronic devices such as smart phones, tablet personal computers (tablet PC), and notebook computers have come into wide consumer usage.

For example, a notebook computer typically includes a main body including a keyboard, and a display. The main body and the display are adjoined so as to be folded into a stowable configuration. Therefore, when the display is open and set at an upwards angle relative to the main body and then placed on a flat surface, the notebook computer is comfortably usable by consumers.

Presently, portable electronic device design is pursuing ever thinner profiles for these devices, which improves convenience of portability, without losing the ability to execute a diversity of computing functions.

However, when a notebook computer having fixed upper and lower surfaces of the main body is designed in this way, it may result in poor cooling efficiency for expelling heat generated inside the main body during operation. This need to expel generated heat results in a physical limitation in the maximum potential thinness of these devices. Furthermore, the poor ability to expel heat typically results in increased temperatures near the keyboard area on the main body, which adversely affects comfort and ease of usability by consumers.

SUMMARY

The present disclosure provides a portable electronic device that expands an inner space between upper and lower surfaces defined with a main body, resulting in improved heat dissipation.

According to certain embodiments of the disclosure, a portable electronic device may include a processor, a temperature sensor, a main board on which the processor and the temperature sensor are mounted, a main body including a first surface and a second surface, an input device disposed on the first surface and the main board disposed on the second surface, wherein the first surface and second surface define a hollow in which the main board is disposed, a display, a height adjuster disposed between the first and second surfaces and including a connection terminal connected to the processor, an extendable bar connected to the connection terminal, and a spacer connected to the extension bar, wherein the processor is configured to: in response to receiving a detection signal from the temperature sensor, control actuation of the height adjuster to cause expansion or contraction of the hollow by movement of the first and second surfaces.

According to certain embodiments of the disclosure, a method in an electronic device includes: receiving a detection signal from a temperature sensor and determining by a processor, based on the received detection signal, whether an ambient temperature for an interior of the electronic device has reached a first threshold temperature, based on detecting that the ambient temperature reaches the first threshold temperature, controlling by the processor actuation of a height adjuster to expand a hollow defined between a first and second surface of the main body, receiving a second detection signal from the temperature sensor and determining, by the processor and based on the second detection signal, whether the ambient temperature has cooled to a second threshold temperature, and when the temperature has cooled to the second threshold temperature, controlling actuation of the height adjuster to contract the hollow of the main body to an original state.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Hereinafter, embodiments of the disclosure will be described in detail with reference to accompanying drawings.

Figure 1:
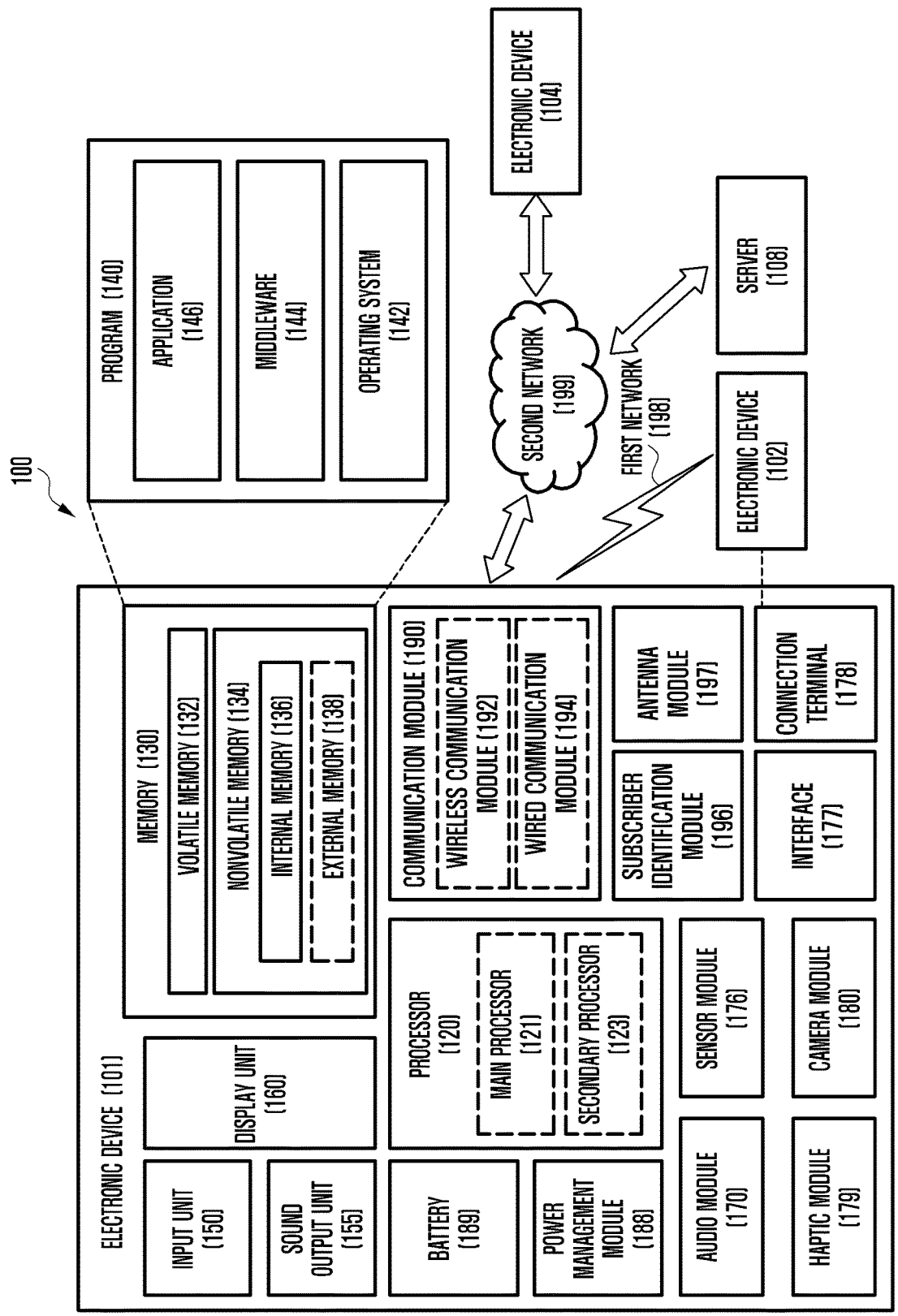
FIG. 1 is a block diagram illustrating an electronic device in a network environment according to certain embodiments.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

The antenna module 197 may transmit/receive a signal or power to/from an external entity (e.g., an external electronic device). According to some embodiments, the antenna module 197 may be formed of a conductor or a conductive pattern and may further include any other component (e.g., RFIC). According to an embodiment, the antenna module 197 may include one or more antennas, which may be selected to be suitable for a communication scheme used in a specific communication network, such as the first network 198 or the second network 199 by, for example, the communication module 190. Through the selected at least one antenna, a signal or power may be transmitted or received between the communication module 190 and the external electronic device.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
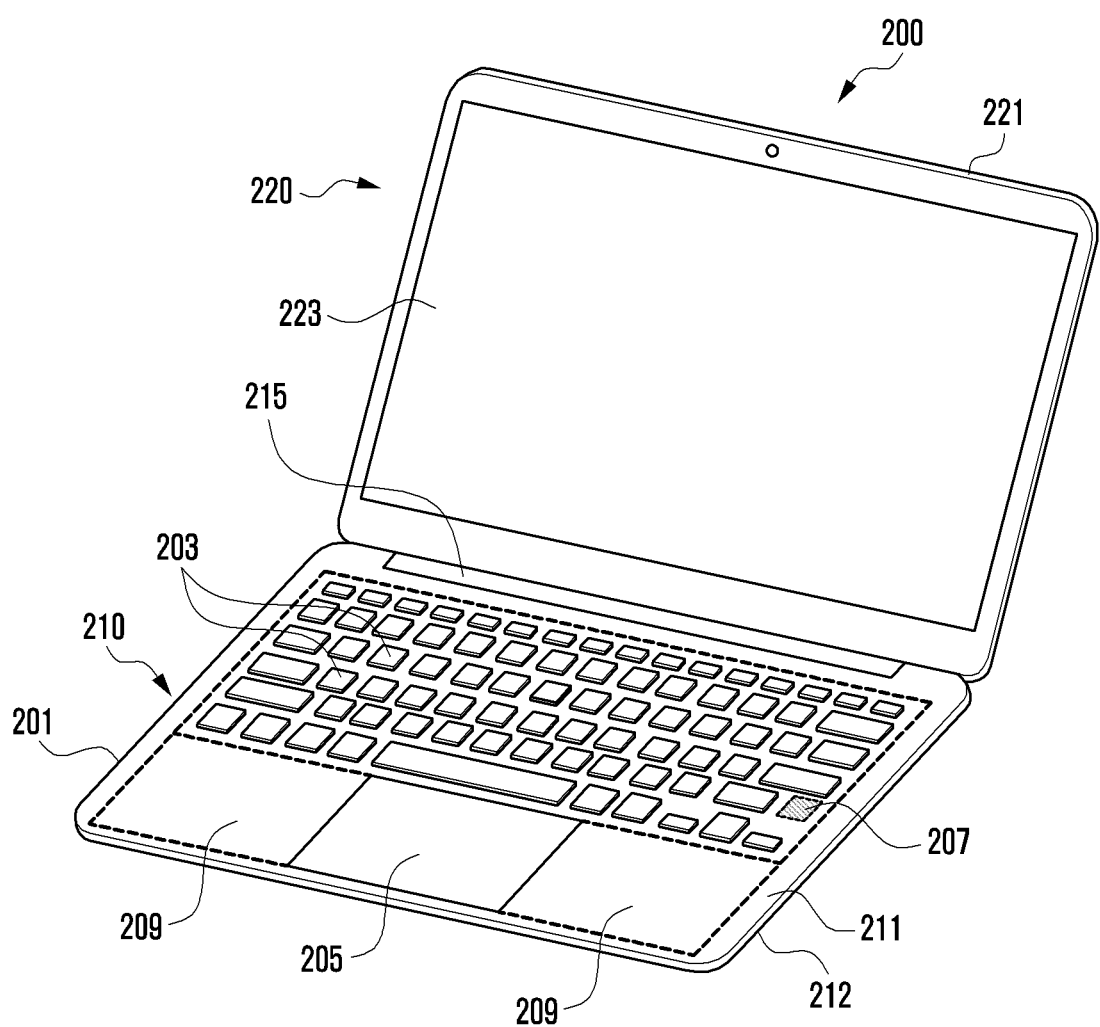
FIG. 2 is a perspective view illustrating a portable electronic device according to certain embodiments.

FIG. 2 is a perspective view illustrating an example portable electronic device according to certain embodiments.

Referring to FIG. 2, the portable electronic device 200 according to certain embodiments may include a main body 210, a connecting portion 215, and a display 220.

According to certain embodiments, the portable electronic device 200 may include the electronic device 101 as shown in FIG. 1. Although a notebook computer is depicted, it is understood that the portable electronic device 200 may include, for example, a smart phone, a notebook computer, a tablet PC, an e-book reader, a portable multimedia device, a portable medical device, a wearable device, or a home appliance.

According to an embodiment, the main body 210 may include a first housing 201, a keyboard 203, a touch pad 205, a temperature sensor 207, and a palm rest 209.

According to certain embodiments, the first housing 201 may form an appearance of the main body 210. The first housing 201 may protect various electronic components (e.g., the processor 120, the memory 130, and the sensor module 176 as shown in FIG. 1) disposed within the main body 210. The first housing 201 may include a first surface 211 which may form an upper surface of the main body 210, and a second surface 212 which may form a lower surface of the main body 210. The first surface 211 and the second surface 212 may be arranged as to face one another. The second surface 212 may form a bottom surface of the main body 210.

According to certain embodiments, the keyboard 203 may include a plurality of keys disposed on the first surface 211. The keyboard 203 may receive inputs of, for example, alphanumeric information by selection of the keys. The keyboard 203 may include a plurality of input keys and function keys. The function keys may correspond to particular functions such as direction keys, volume keys, and shortcut keys. The keyboard 203 may include keys arranged in configurations of one or more of a QWERTY key layout, a 3*4 key layout, a 4*3 key layout, or any other key layout.

According to certain embodiments, the touch pad 205 may provide pointer control (e.g., paralleling that of a mouse input device). The touch pad 205 may also permit inputs a command for selecting or executing an application displayed on the display 220, via mechanical buttons disposed in the touch pad 205 area, and/or buy permitting special touch functions (e.g., multi-touch taps, drags, zooms, etc.).

According to certain embodiments, the temperature sensor 207 (e.g., the sensor module 176 in FIG. 1) may be disposed adjacent to the keyboard 203. The temperature sensor 207 may be mounted on a main board (e.g., a main board 320 in FIG. 3) within the main body 210. The temperature sensor 207 may be disposed within the first surface 211. The temperature sensor 207 may detect an ambient temperature within the main body 210, resultant from heat generated by operation of the internal electronic components.

According to certain embodiments, the palm rest 209 may be provided in order to reduce wrist fatigue during use of the keyboard 203.

According to an embodiment, the connecting portion 215 may connect the main body 210 and the display 220 to be folded or unfolded. The connecting portion 215 may mechanically connect the main body 210 and the display 220. In this case, the connecting portion 215 may include a hinge member allowing rotation of the display 220 relative to the main body 210. Further, the connecting portion 215 may electrically connect the main body 210 and the display 220. In this case, the connecting portion 215 may include a flexible printed circuit board (FPCB) at a certain position thereof.

According to an embodiment, the display 220 may include a second housing 221 and a screen 223.

According to certain embodiments, the second housing 221 may form an appearance of the display 220. The second housing 221 may protect the various electronic components (e.g., the camera module 180 and the audio output device 155 as shown in FIG. 1) disposed within the display 220 and the screen 223, or proximate (or adjacent) to them.

According to certain embodiments, the screen 223 may display information (e.g., menus) related to operation of the portable electronic device 200, information entered by the user through the keyboard 203, and/or information to be provided to the user. The screen 223 may be formed of at least one of a liquid crystal display (LCD), an organic light emitting diode (OLED), an active matrix OLED (AMOLED), a flexible display, or a transparent display. The screen 223 may display at least one of various screens provided in accordance with the use of the portable electronic device 200, for example, a home screen, a menu screen, a lock screen, a game screen, a web page screen, a call screen, or a music or video playback screen.

Figure 3:
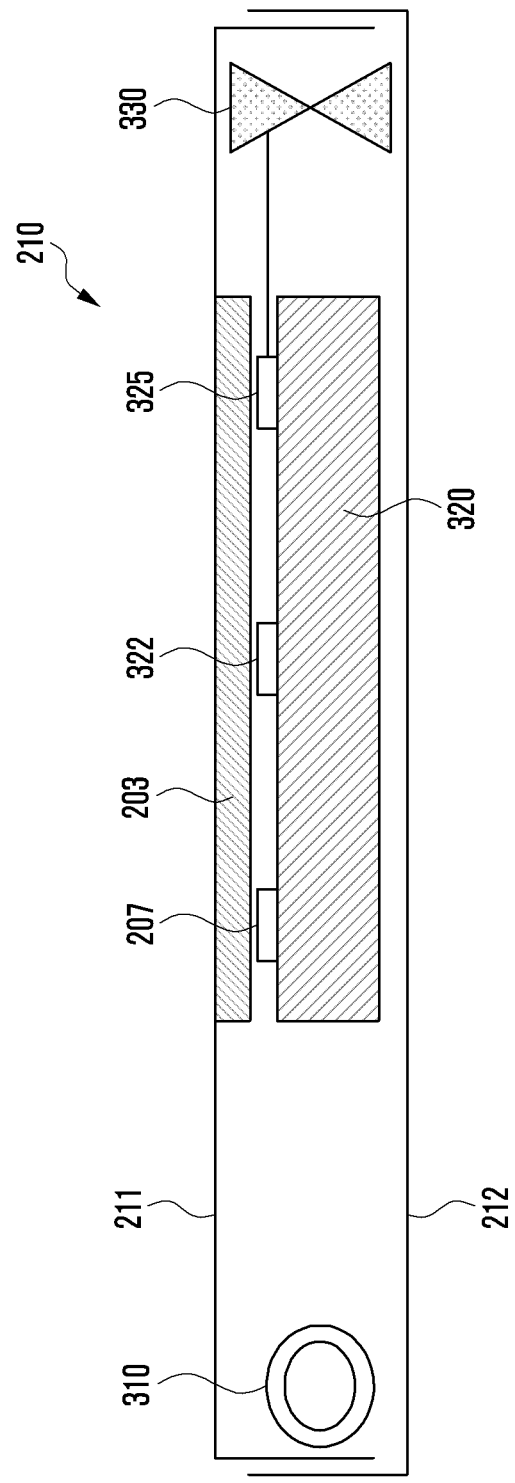
FIG. 3 is a diagram illustrating a schematic configuration of a main body of a portable electronic device according to certain embodiments.

FIG. 3 is a diagram illustrating a schematic configuration of a main body of a portable electronic device according to certain embodiments.

In the following description about FIG. 3, many of the components and functions correspond to those described above in FIGS. 1 and 2, and so, for the sake of brevity, will not be described again.

Referring to FIG. 3, the main body 210 of the portable electronic device 200 according to certain embodiments may further include a hinge part 310, a main board 320, a memory 322, a processor 325, and/or a height adjuster 330.

According to an embodiment, the hinge part 310 may be disposed at a certain position between the first surface 211 (e.g., an upper surface) and the second surface 212 (e.g., a lower surface) both of the main body 210 (e.g., the lower, keyboard-equipped portion of a notebook). The hinge part 310 may be rotated to raise or lower the height of the first surface 211 relative to the second surface 212, in accordance with the operation of the height adjuster 330. One or more hinge parts 310 may be disposed around the connecting portion 215 shown in FIG. 2.

According to an embodiment, the main board 320 may be disposed under the keyboard 203 disposed within the first surface 211. The main board 320 may include a printed circuit board (PCB). The main board 320 may be disposed on the second surface 212. The temperature sensor 207 (also shown in FIG. 2) may be mounted on the main board 320. For example, the temperature sensor 207 may detect a temperature, caused by heat generated from operation of the electronic components including the memory 322 or the processor 325, and provide a signal indicating the detected temperature to the processor 325.

According to certain embodiments, the temperature sensor 207 may also be mounted within the processor 325. In this case, the temperature sensor 207 may detect a temperature generated from the processor 325.

According to certain embodiments, the temperature sensor 207 may detect a temperature generated from the main board 320.

According to an embodiment, the memory 322 (e.g., the memory 130 in FIG. 1) may be mounted on the main board 320. The memory 322 may store data for gradually controlling the height adjuster 330 in accordance with the detection signal of the temperature sensor 207.

According to certain embodiments, the memory 322 may store an operating system (OS), a program related to the operation of the processor 325, various applications, and input/output data. The memory 322 may also store a program for controlling the overall operation of the portable electronic device 200. The memory 322 may also store a user interface (UI) provided by the portable electronic device 200 and various kinds of setting information utilized for processing a function in the portable electronic device 200.

According to an embodiment, the processor 325 (e.g., the processor 120 in FIG. 1) may be mounted on the main board 320. The processor 325 may control the height adjuster 330 in accordance with the signal received from the temperature sensor 207. The processor 325 may gradually control the height adjuster 330, based on a specific information (e.g., temperature) preset in the memory 322. That is, particular heights of separation may be pre-associated with certain temperatures or temperature thresholds, in order to improve cooling at higher temperatures.

According to certain embodiments, the processor 325 may be operatively connected to the keyboard 203, the temperature sensor 207, the screen 223, the memory 322, and the height adjuster 330, thus controlling the functions and operations of such components. The processor 325 may be formed of, for example, a central processing unit (CPU), an application processor, a communication processor, and/or the like. The processor 325 may be configured as a single core processor or a multi-core processor. The processor 325 may be implemented using a plurality of processors.

According to an embodiment, the height adjuster 330 may configure the dimensions of an inner space defined between the first and second surfaces 211 and 212 of the main body 210, according to the control of the processor 325. In particular, the height adjuster 330 may expand a height of the space defined between the keyboard 203 and the main board 320 by control of the processor 325. Expanding the space between the keyboard 203 and the main board 320 may result in increased air flow and improved heat dissipation efficiency. According to certain embodiments, the height adjuster 330 may include a linear actuator or a motor capable of producing movement.

Figure 4:
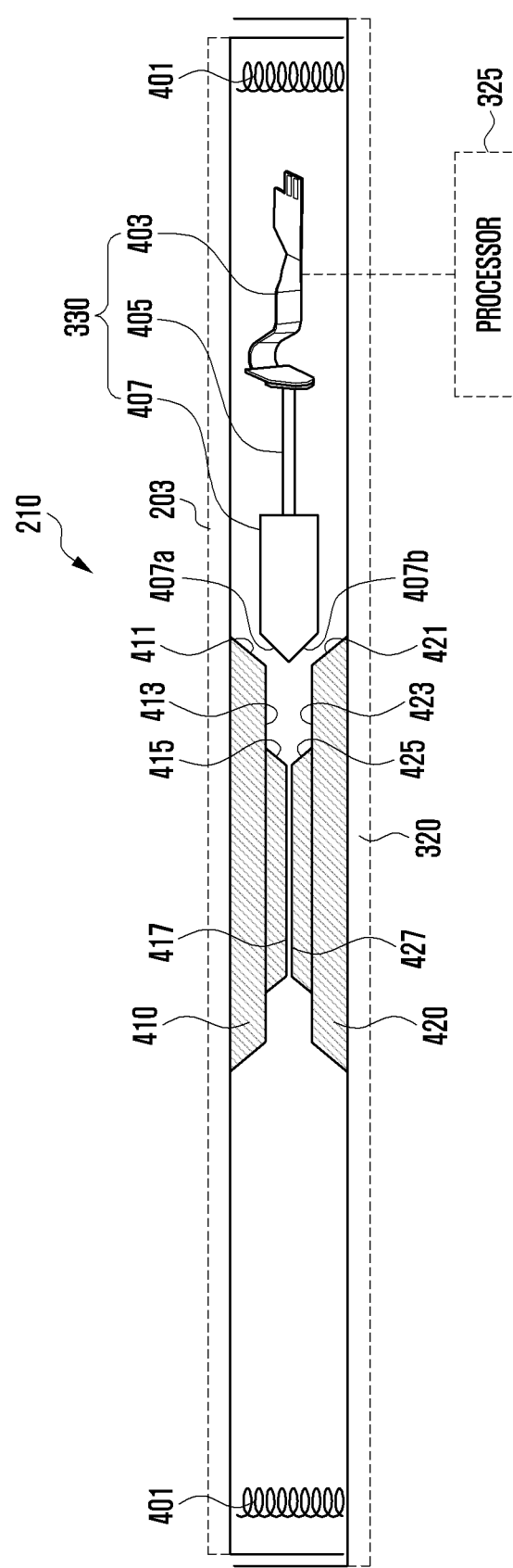
FIG. 4 is a diagram illustrating a detailed configuration of a main body of a portable electronic device according to certain embodiments.

FIG. 4 is a diagram illustrating a detailed configuration of a main body of a portable electronic device according to certain embodiments.

In the following description about FIG. 4, many of the components and functions correspond to those described above in FIGS. 1 to 3, and so, for the sake of brevity, will not be described again.

Referring to FIG. 4, the main body 210 of the portable electronic device 200 according to certain embodiments may include the height adjuster 330, a spring 401, a first plate 410, and a second plate 420.

According to an embodiment, the height adjuster 330 may include a connection terminal 403, an extension bar 405, and a spacer 407.

According to certain embodiments, the connection terminal 403 may be connected to the processor 325 which transmits a control signal to the height adjuster 330.

According to certain embodiments, the extension bar 405 may be connected between the connection terminal 403 and the spacer 407. The extension bar 405 may adjust an extension distance thereof in accordance with a control signal received from the processor 325.

According to certain embodiments, the spacer 407 may gradually expand a height of the space defined between the first plate 410 and the second plate 420, in accordance with a control signal received from the processor 325. The spacer 407 may have, at one end thereof, a first inclined portion 407a and a second inclined portion 407b. The spacer 407 may be configured to have an arrow-like shape, through a pair of the first and second inclined portions 407a and 407b. The first inclined portion 407a may be formed at one end of an upper half of the spacer 407, and the second inclined portion 407b may be formed at one end of a lower half of the spacer 407. Excepting the first and second inclined portions 407a and 407b, the remaining portions of the spacer 407 may have a flat plate shape.

According to an embodiment, the spring 401 provides a restoring force. That is, in order to revert a height of the space between the first and second plates 410 and 420 to an original state after expansion by the operation of the height adjuster 330, the contracting force of the spring 401 may be applied. The spring 401 may include a coil spring. The spring 401 may stretch or retract in the thickness direction of the main body 210. At least one spring 401 may be included in the main body 210.

According to an embodiment, the first plate 410 may be disposed under the keyboard 203, and the second plate 420 may be disposed above the main board 320. The first plate 410 and the second plate 420 may be disposed to face one another while disposed spaced apart from each other.

According to certain embodiments, the first plate 410 may include a first inclined plane 411, a first flat plane 413, a second inclined plane 415, and a second flat plane 417. Similarly, the second plate 420 may include a third inclined plane 421, a third flat plane 423, a fourth inclined plane 425, and a fourth flat plane 427.

According to certain embodiments, the first inclined plane 411 and the third inclined plane 421 may be disposed to face each other. Similarly, the second inclined plane 415 and the fourth inclined plane 425 may be disposed to face each other. In addition, the first flat plane 413 and the third flat plane 423 may be disposed to face each other. Similarly, the second flat plane 417 and the fourth flat plane 427 may be disposed to face each other.

According to certain embodiments, a gap (or distance) between the first flat plane 413 and the third flat plane 423 may be smaller than the thickness of the spacer 407. Therefore, when the spacer 407 is inserted into a space between the first and third flat planes 413 and 423 through the first and third inclined planes 411 and 421, the space between the first and third flat planes 413 and 423 may be expanded. At this time, the spring 401 may also be stretched. The spacer 407 inserted between the first and third flat planes 413 and 423 may be maintained in an interposed state. In this case, even if the user of the portable electronic device 200 presses the keyboard 203 for an input action, the space between the first and third flat planes 413 and 423 may keep unvaried through the spacer 407.

According to certain embodiments, a gap (or distance) between the second flat plane 417 and the fourth flat plane 427 may be smaller than the gap (or distance) between the first and third flat planes 413 and 423. Therefore, the gap (or distance) between the second and fourth flat planes 417 and 427 may be further smaller than the thickness of the spacer 407. When the spacer 407 is further inserted into a space between the second and fourth flat planes 417 and 427 through the second and fourth inclined portions 415 and 425, the space between the second and fourth flat planes 417 and 427 may be expanded. At this time, the spring 401 may be further stretched. The spacer 407 inserted between the second and fourth flat planes 417 and 427 may be maintained in an interposed state. In this case, even if the user of the portable electronic device 200 presses the keyboard 203 for an input action, the space between the second and fourth flat planes 417 and 427 may keep unvaried through the spacer 407.

According to certain embodiments, an expanded space between the keyboard 203 and the main board 320 may be greater when the spacer 407 is interposed between the second and fourth flat planes 417 and 427 than when interposed between the first and third flat planes 413 and 423. Therefore, a flow of air between the keyboard 203 and the main board 320 becomes more improved, resulting in more efficient dissipation of heat generated from the main board 320.

Figure 5:
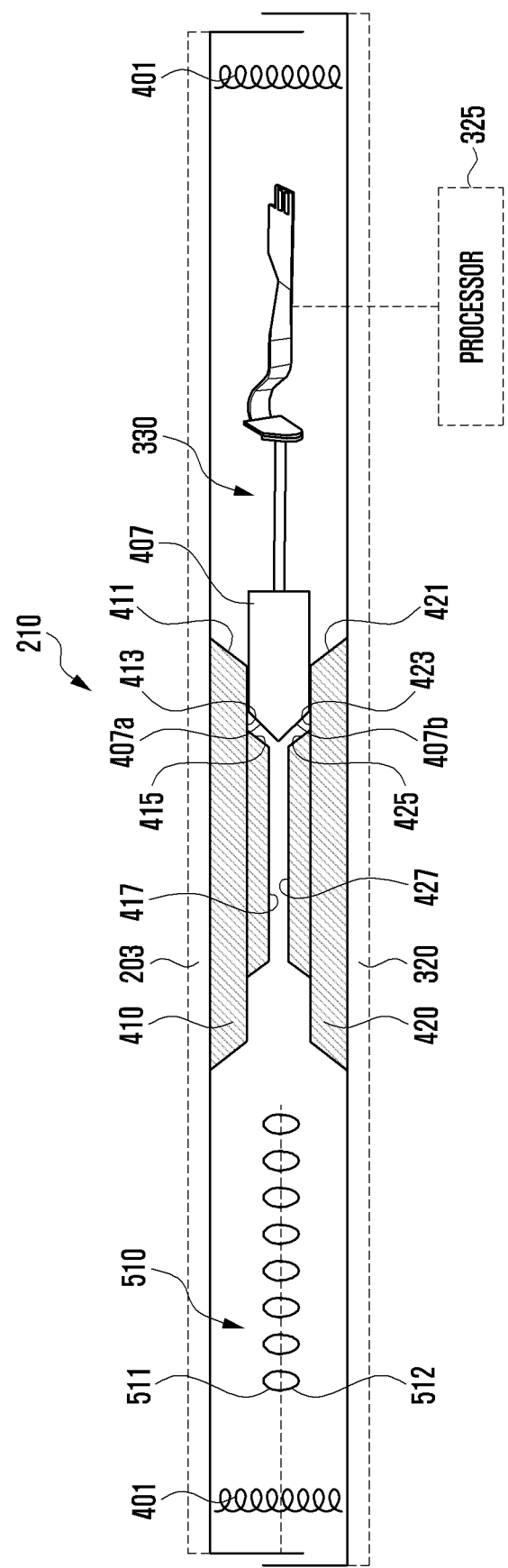
FIG. 5 is a diagram illustrating an example where a first expanded space is formed in a main body of a portable electronic device according to certain embodiments.

FIG. 5 is a diagram illustrating an example in which a first expanded space is formed in a main body of a portable electronic device according to certain embodiments.

In the following description about FIG. 5, many of the components and functions correspond to those described above in FIGS. 1 to 4, and so for the sake of brevity, they will not be described again.

Referring to FIG. 5, the main body 210 of the portable electronic device 200 according to certain embodiments may further define an air vent 510.

According to an embodiment, the air vent 510 may be disposed between the keyboard 203 and the main board 320. For example, a plurality of air vents 510 may be formed, as depicted in FIG. 5.

According to certain embodiments, the air vent 510 may include a first cover 511 and a second cover 512. Each of the first and second covers 511 and 512 may have a semicircular shape. Therefore, when the first cover 511 and the second cover 512 are combined (e.g., overlaid with one another), a circular shape may be formed.

According to certain embodiments, when the spacer 407 of the height adjuster 330 is inserted into a space between the first and third flat planes 413 and 423 under the control of the processor 325, the first and second covers 511 and 512 of the air vent 510 may be moved in opposite directions, respectively.

According to certain embodiments, the temperature sensor 207 may detect that a temperature of the inside of the main body 210 or a temperature of a component (e.g., the main board 320, the processor 325) is greater than a first predetermined temperature threshold (e.g., about 38 degrees Celsius). Then the temperature sensor 207 may transmit a detection signal to the processor 325, causing the processor 325 to actuate control of the height adjuster 330 in accordance with the detection signal (e.g., the temperature). For example, by control of the processor 325, the height adjuster 330 may cause the spacer 407 to be inserted into the space between the first and third flat planes 413 and 423 through sliding of the first and second inclined portions 407a and 407b of the spacer 407 along the first and third inclined planes 411 and 421. As a result, a height of the interior space is expanded resulting in a first expanded space being formed between the first and third flat planes 413 and 423. In addition, a second expanded space is formed between the second and fourth flat planes 417 and 427. At the same time, air vent 510 openings may be enlarged as the first and second covers 511 and 512 move away from one another, and the spring 401 may also be stretched as it is expanded in height along with the main body 210. The first and second expanded spaces therefore improve a flow of air between the keyboard 203 and the main board 320, thus improving the dissipation of heat generated from the main board 320.

Figure 6:
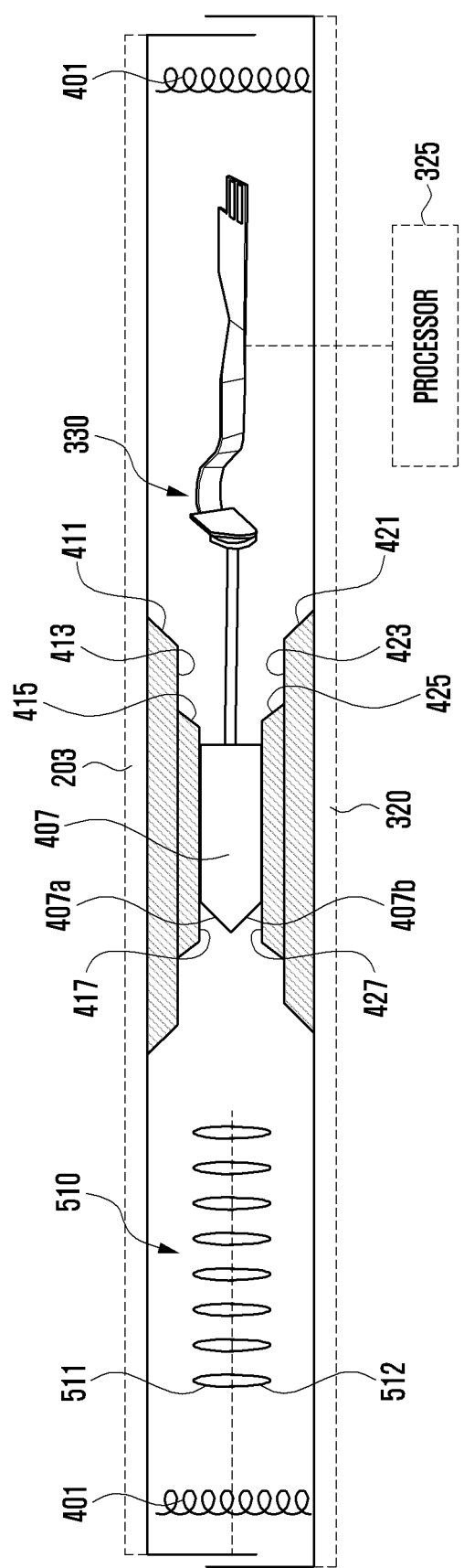
FIG. 6 is a diagram illustrating an example where a second expanded space is formed in a main body of a portable electronic device according to certain embodiments.

FIG. 6 is a diagram illustrating an example where a second expanded space is formed in a main body of a portable electronic device according to certain embodiments.

In the following description about FIG. 6, the same configuration and function as those described above in FIGS. 1 to 5 may not be described again.

Referring to FIG. 6, when the spacer 407 of the height adjuster 330 is inserted into a space between the second and fourth flat planes 417 and 427 by control of the processor 325, the first and second covers 511 and 512 of the air vent 510 may move away from each other in opposite directions, respectively.

According to certain embodiments, this movement results in an increase in the size of the air vent 510 to its largest potential size, when the spacer 407 is interposed between the second and fourth flat planes 417 and 427. The spread of the air vent 510 is larger here than when interposed between the first and third flat planes 413 and 423. In addition, the first and second covers 511 and 512 of the air vent 510 may be more greater expanded when the spacer 407 is interposed between the second and fourth flat planes 417 and 427 than when interposed between the first and third flat planes 413 and 423.

According to certain embodiments, the temperature sensor 207 may detect that a temperature of the inside of the main body 210 or a temperature of a component (e.g., the main board 320, the processor 325) is greater than a second predetermined temperature threshold (e.g., about 42 degrees Celsius). Then the temperature sensor 207 may transmit a detection signal to the processor 325, so that the processor 325 may control the height adjuster 330 in accordance with the detection signal. For example, by the control of the processor 325, the height adjuster 330 may cause the spacer 407 to be inserted further into a space defined between the second and fourth flat planes 417 and 427, through further actuation of the first and second inclined portions 407a and 407b of the spacer 407 along the second and fourth inclined planes 415 and 425. As a result, the first expanded space is increased between the first and third flat planes 413 and 423, and the second expanded space is increased between the second and fourth flat planes 417 and 427. At the same time, the first and second covers 511 and 512 of the air vent 510 may be further stretched in the thickness direction of the main body 210, and the spring 401 may also be further stretched in the thickness direction of the main body 210. The first and second expanded spaces can improve a flow of air between the keyboard 203 and the main board 320, thus improving the dissipation of heat generated from the operation of computing components on the main board 320.

Figure 7:
FIG. 7 is a graph showing a temperature change dependent on a distance of an expanded space in a main body of a portable electronic device according to certain embodiments.

FIG. 7 is a graph showing a temperature change relative to an expansion in height of the space in the main body (as measured by distance) of a portable electronic device according to certain embodiments.

Referring to FIG. 7, the temperature change according to the distance of the expanded space between the keyboard 203 (disposed on the first surface 211 of the main body 210) and the main board 320 (disposed on the second surface 212) may be as shown in Table 1 below.

TABLE 1

| Temperature of heat source in main body (° C.) | Increased height of expanded space (mm) | Changed temperature (° C.) |
| --- | --- | --- |
| 79.5 | 5 | 38.6 |
| 76.4 | 2 | 45.8 |
| 73.1 | 1 | 51.2 |
| 68.3 | 0.5 | 54.9 |

As shown in FIG. 7 and Table 1, as the expanded space between the keyboard 203 and the main board 320 in the main body 210 increases, the heat dissipation for the heat source in the main body 210 becomes more effective.

Figure 8:
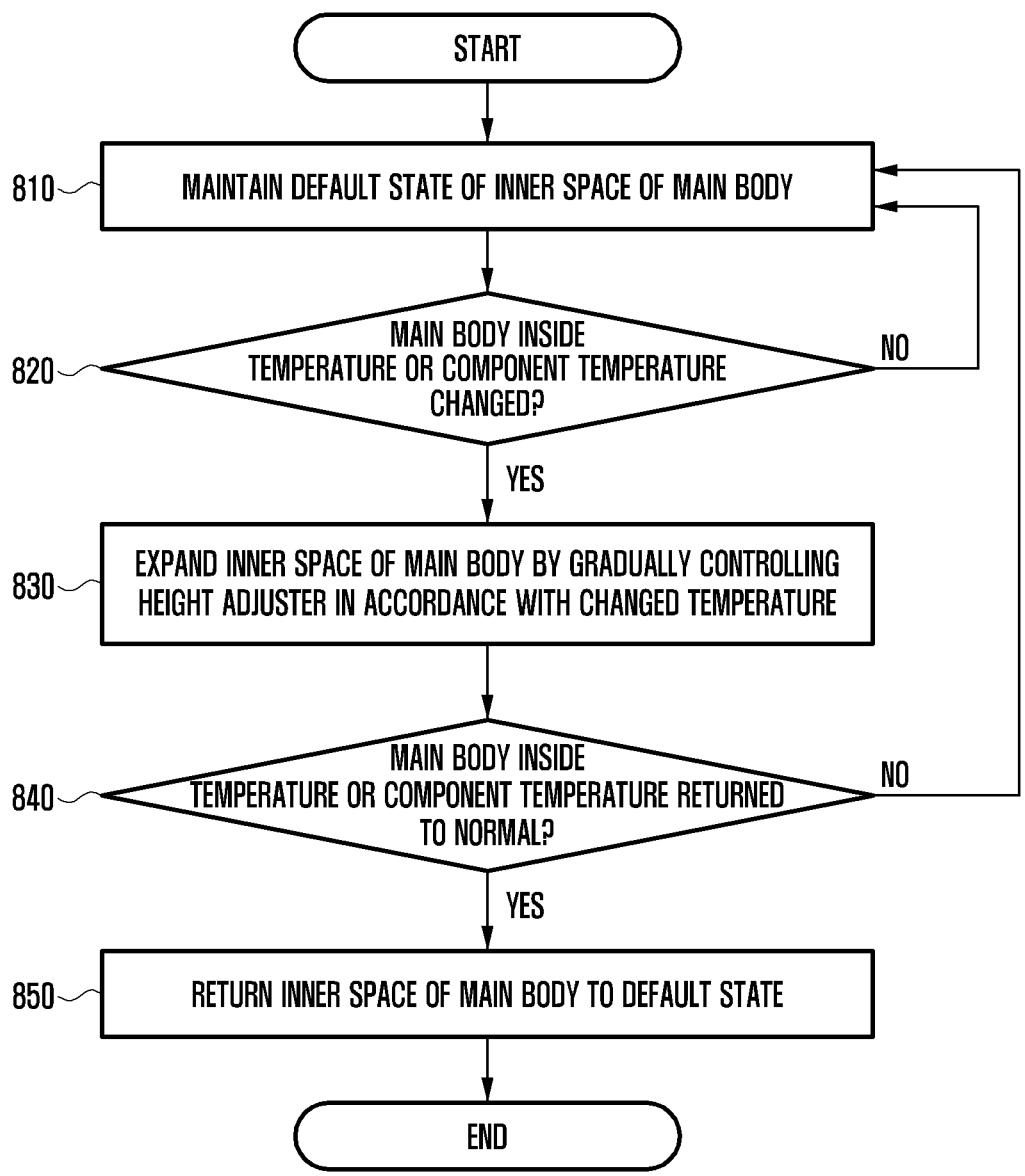
FIG. 8 is a flow diagram illustrating a method of expanding an inner space of a main body of a portable electronic device according to certain embodiments.

FIG. 8 is a flow diagram illustrating a method of expanding an inner space of a main body of a portable electronic device according to certain embodiments.

At operation 810, the inner space of the main body 210 between the keyboard 203 disposed on the first surface 211 and the main board 320 disposed on the second surface 212 may be maintained in a default state.

At operation 820, the processor 325 may receive a signal from the temperature sensor 207 and determine whether a temperature of the inside of the main body 210 or a temperature of a component (e.g., the main board 320, the processor 325) in the main body 210 reaches a threshold temperature, or a threshold increase in temperature.

According to certain embodiments, when heat is generated at a heat source such as the memory 322 or the processor 325 mounted on the main board 320 and thereby a temperature is increased in the main body 210, the temperature sensor 207 may detect a threshold temperature (or threshold increase in temperature) and deliver this detection signal to the processor 325.

At operation 830, the processor 325 may actuate movement of the height adjuster 330 in response to the detection signal of the temperature sensor 207, in accordance with a changed temperature of the interior of the main body 210 or of the component (e.g., the main board 320, the processor 325). Therefore, a height of the inner space of the main body 210 defined between the keyboard 203 disposed on the first surface 211 and the main board 320 disposed on the second surface 212 may be increased results in an overall expansion of the inner space.

According to certain embodiments, the processor 325 may control actuation of the height adjuster 330 based on specific information (e.g., temperature) preset in the memory 322, based on the main board inside temperature or the component temperature. In other words, heights may be pre-associated with one or more threshold temperatures or temperature increases, such that when the threshold condition is detected, the height adjuster 330 may be actuated to achieve the corresponding pre-associated height.

According to certain embodiments, when identifying from the detection signal of the temperature sensor 207 that the main board inside temperature or the component temperature is greater than a first predetermined temperature (e.g., about 38 degrees Celsius), the processor 325 may control the height adjuster 330 such that the spacer 407 is inserted into a space between the first and third flat planes 413 and 423 through sliding of the first and second inclined portions 407a and 407b of the spacer 407 along the first and third inclined planes 411 and 421.

According to certain embodiments, when identifying from the detection signal of the temperature sensor 207 that the main board inside temperature or the component temperature is greater than a second predetermined temperature (e.g., about 42 degrees Celsius), the processor 325 may control the height adjuster 330 such that the spacer 407 is inserted into a space between the second and fourth flat planes 417 and 427 through sliding of the first and second inclined portions 407a and 407b of the spacer 407 along the second and fourth inclined planes 415 and 425.

At operation 840, the processor 325 may determine whether the interior ambient temperature or the component temperature has reached a second threshold temperature (e.g., a normal operating temperature) or whether as sufficient temperature decrease threshold has been achieved.

According to certain embodiments, from the detection signal of the temperature sensor 207, the processor 325 may identify whether the main board inside temperature or the component temperature has been lowered below the first predetermined temperature (e.g., about 38 degrees Celsius).

At operation 850, when the main board inside temperature or the component temperature has returned to normal, the processor 325 may return the inner space of the main body 210 (between the keyboard 203 disposed on first surface 211 and the main board 320 disposed on the second surface 212) to the default state, i.e., to the original state before expansion.

According to certain embodiments, when the main board inside temperature or the component temperature does not return to normal, the processor 325 may maintain the inner space in the expanded state.

As described hereinbefore, according to certain embodiments of the disclosure, when a high temperature is detected in the main body 210 of the portable electronic device 200, the processor 325 of the portable electronic device 200 can expand an inner space of the main body 210 between the keyboard 203 disposed on the first surface 211 and the main board 320 disposed on the second surface 212 in order to perform more efficient heat dissipation. This is helpful to in providing a thinner portable electronic device 200.

While the disclosure has been particularly shown and described with reference to example embodiments thereof, it will be understood by those skilled in the art that various changes in form and details may be made therein without departing from the subject matter as defined by the appended claims.

What is claimed is:

1. An electronic device, comprising:
   a processor;
   a temperature sensor;
   a main board on which the processor and the temperature sensor are mounted;
   a main body including a first surface and a second surface, an input device disposed on the first surface and the main board disposed on the second surface, wherein the first surface and second surface define a hollow in which the main board is disposed;
   a display;
   a height adjuster disposed between the first and second surfaces and including a connection terminal connected to the processor;
   an extendable bar connected to the connection terminal; and
   a spacer connected to the extension bar,
   wherein the processor is configured to:
   in response to receiving a detection signal from the temperature sensor, control actuation of the height adjuster to cause expansion or contraction of the hollow by movement of the first and second surfaces.

2. The electronic device of claim 1, wherein the main body further includes a hinge disposed between the first and second surfaces, the hinge enabling rotation of the first surface relative to the second surface.

3. The electronic device of claim 1, wherein the main body further includes a memory storing at least one threshold temperature in association with at least one distance corresponding to a degree of movement of the first and second surfaces.

4. The electronic device of claim 1, wherein the height adjuster is configured to expand or contract the hollow using movement of the spacer.

5. The electronic device of claim 4, wherein the spacer includes a first inclined portion and a second inclined portion, the first and second inclined portions disposed at one end of the spacer.

6. The electronic device of claim 5, wherein the main body further includes:
   a first plate disposed under the input device;
   a second plate disposed above the main board; and
   a spring connecting the first surface and the second surface, the spring tensioned when the first surface and the second surface are moved away from one another in order to provide a restoring force to contract the first and second surface after expansion of the hollow.

7. The electronic device of claim 6, wherein the first plate includes a first inclined plane, a first flat plane, a second inclined plane, and a second flat plane,
   wherein the second plate includes a third inclined plane, a third flat plane, a fourth inclined plane, and a fourth flat plane, and
   wherein the first inclined plane and the third inclined plane are disposed to face one another, the second inclined plane and the fourth inclined plane are disposed to face one another, the first flat plane and the third flat plane are disposed to face one another, and the second flat plane and the fourth flat plane are disposed to face one another.

8. The electronic device of claim 7, wherein a gap between the first flat plane and the third flat plane is smaller than a thickness of the spacer, and
   wherein a second gap between the second flat plane and the fourth flat plane is smaller than the gap between the first and third flat planes.

9. The electronic device of claim 7, wherein when the spacer is inserted into a space between the first and third flat planes through the first and third inclined planes, the space between the first and third flat planes is expanded resulting in expansion of the hollow, and
   wherein the spacer is inserted into a space between the second and fourth flat planes through the second and fourth inclined planes, the space between the second and fourth flat planes is expanded resulting in a second expansion of the hollow.

10. The electronic device of claim 9, wherein a size of the expanded hollow is greater when the spacer is inserted between the second and fourth flat planes, than when the spacer is inserted between the first and third flat planes.

11. The electronic device of claim 7, wherein when the temperature sensor detects an increase of temperature to be greater than a first predetermined temperature threshold, the processor controls the height adjuster such that the spacer is inserted into a space between the first and third flat planes through sliding of the first and second inclined portions of the spacer along the first and third inclined planes.

12. The electronic device of claim 11, wherein when the temperature sensor detects the increase of temperature to be greater than a second predetermined temperature threshold, the processor controls the height adjuster such that the spacer is inserted into a space between the second and fourth flat planes through sliding of the first and second inclined portions of the spacer along the second and fourth inclined planes.

13. The electronic device of claim 12, wherein the second predetermined temperature is greater than the first predetermined temperature.

14. The electronic device of claim 1, wherein the main body further defines an air vent opening in the main body, the air vent opening including a first opening defined in the first surface and a second opening defined in the second surface, and
  wherein the air vent opening is expanded when the hollow is expanded according to movement of the first opening of the first surface away relative to movement of second opening of the second surface.

15. A method in an electronic device, comprising:
  receiving a detection signal from a temperature sensor and determining by a processor, based on the received detection signal, whether an ambient temperature for an interior of the electronic device has reached a first threshold temperature;
  based on detecting that the ambient temperature reaches the first threshold temperature, controlling by the processor actuation of a height adjuster to expand a hollow defined between a first and second surface of a main body;
  receiving a second detection signal from the temperature sensor and determining, based on the second detection signal, whether the ambient temperature has cooled to a second threshold temperature; and
  when the temperature has cooled to the second threshold temperature, controlling actuation of the height adjuster to contract the hollow of the main body to an original state,
  wherein the electronic device includes a first plate and a second plate, the first plate and second plate defining pairs of stepped sloped surfaces,
  wherein the height adjuster is operably connected to a spacer insertable between the first plate and the second plates to expand the hollow, and
  wherein the actuation of the height adjuster includes moving the spacer to engage a first pair of the stepped sloped surfaces of the first and second plates to expand the hollow to a first size.

16. The method of claim 15, wherein the height adjuster is actuated based on information stored in memory, the information indicating at least one threshold temperature stored in association with at least one distance indicating a degree of expansion of the main body.

17. The method of claim 15, wherein when the second detection signal indicates that the ambient temperature is higher than the second threshold temperature, the processor controls actuation of the height adjuster to maintain expansion of the hollow.

18. The method of claim 15, wherein when the second detection signal indicates that the ambient temperature is higher than the first threshold temperature, the height adjuster is controlled to further insert the spacer between the first and second plates to engage a second pair of stepped sloped surfaces of the first and second plates and expand the hollow to a second size.

19. The method of claim 18, wherein the hollow is larger when the spacer is inserted to engage the second pair of stepped sloped surfaces, than when the spacer is inserted to engage the first pair of stepped sloped surfaces.

* * * * *